United States Patent
Zhan et al.

(10) Patent No.: US 8,810,296 B2
(45) Date of Patent: Aug. 19, 2014

(54) D FLIP-FLOP WITH HIGH-SWING OUTPUT

(71) Applicant: Taiwan Semiconductor Manufacturing Company, Ltd., Hsin-Chu (TW)

(72) Inventors: Hao-Jie Zhan, Hsin-Chu (TW); Tsung-Hsin Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1 day.

(21) Appl. No.: 13/667,656

(22) Filed: Nov. 2, 2012

(65) Prior Publication Data
US 2014/0021995 A1 Jan. 23, 2014

Related U.S. Application Data

(60) Provisional application No. 61/674,134, filed on Jul. 20, 2012.

(51) Int. Cl.
*H03K 3/356* (2006.01)

(52) U.S. Cl.
CPC ................ *H03K 3/356* (2013.01); *H03K 3/356104* (2013.01)
USPC ........................................ 327/208

(58) Field of Classification Search
USPC ............ 327/199–203, 208–215, 218, 219, 327/223–225, 99, 407–410
See application file for complete search history.

(56) References Cited

U.S. PATENT DOCUMENTS

| | | | |
|---|---|---|---|
| 6,559,683 B1 * | 5/2003 | Kwon et al. | 327/43 |
| 6,909,417 B2 * | 6/2005 | Washio et al. | 345/98 |
| 7,256,633 B1 * | 8/2007 | Rafiq | 327/202 |
| 2005/0285658 A1 * | 12/2005 | Schulmeyer et al. | 327/333 |

* cited by examiner

*Primary Examiner* — Sibin Chen
(74) *Attorney, Agent, or Firm* — Slater & Matsil, L.L.P.

(57) ABSTRACT

A D flip-flop includes a first switch, a level shifter, and a second switch therein. The first switch includes a first input and a first output. The level shifter includes a second input coupled to the first input, and a second output. The second switch includes a third input coupled to the second output, and a third output. The first input and the third output form an input and an output of the D flip-flop.

19 Claims, 5 Drawing Sheets

D FLIP-FLOP WITH HIGH-SWING OUTPUT

This application claims the benefit of the following provisionally filed U.S. patent application Ser. No. 61/674,134, filed Jul. 20, 2012, and entitled "D Flip-Flop with High-Swing Output;" which application is hereby incorporated herein by reference.

BACKGROUND

D flip-flops are widely used integrated circuit devices. A D flip-flop includes a data input, a data output, and a clock input. The D flip-flop captures the value of the data input at a definite portion of the clock cycle, such as the rising edge of the clock signal received at the clock input. The captured value is sent out to the output at another time, for example, at the rising edge of a complementary clock of the clock signal. At other times, the output of the D flip-flop does not change. The D flip-flop can be viewed as a memory cell, a zero-order hold, or a delay line. The D flip-flops have many usages in integrated circuits. For example, the D flip-flops can be used as shift registers.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A D flip-flop (DFF) is provided in accordance with various exemplary embodiments. The variations and the operation of the embodiments are discussed. Throughout the various views and illustrative embodiments, like reference numbers are used to designate like elements.

Figure 1:
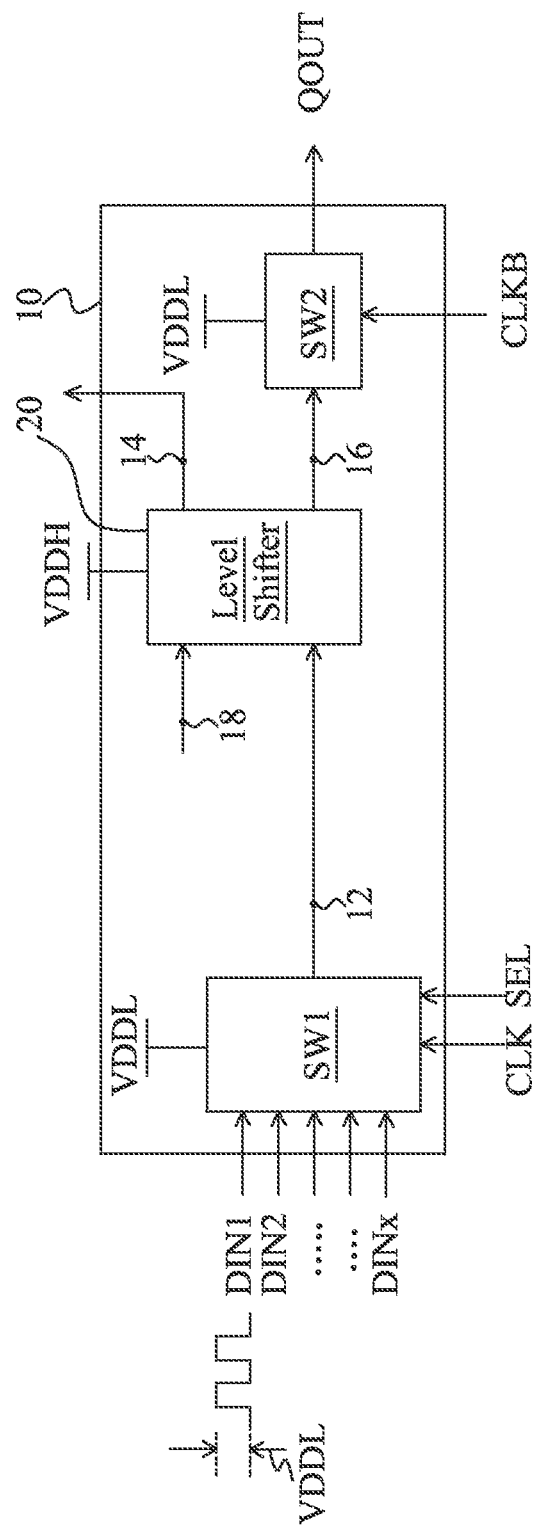
FIG. 1 is a block diagram of a D flip-flop in accordance with exemplary embodiments, wherein the D flip-flop includes multiple inputs and a level shifter built in the D flip-flop.

FIG. 1 illustrates a block diagram of DFF 10. In some embodiments, DFF 10 is a multi-input DFF comprising a plurality of inputs DIN1, DIN2 . . . and DINx, wherein x is an integer equal to or greater than 2. In alternative embodiments, DFF 10 is a single-input DFF, which includes DIN1 as the single input. Input selection node SEL is used to choose an input among inputs DIN1, DIN2 . . . and DINx, and the data on the chosen input is passed to output node QOUT, while the data on the un-selected inputs are not passed to output node QOUT. At one specific period of time, at most one of inputs DIN1, DIN2 . . . and DINx is selected. The signal on input selection node SEL may be changed from time to time, so that during different periods of time, different ones of the inputs DIN1, DIN2 . . . and DINx may be selected. Therefore, by controlling selection control signal on input selection node SEL, the data on the selected ones of inputs DIN1, DIN2 . . . and DINx may be passed through switch SW1, and provided to output node QOUT.

DFF 10 also includes level shifter 20, which is used to receive a first signal passing through switch SW1, which first signal has a first swing, and generate a second signal having a second swing greater than the first swing. In accordance with some embodiments, the first swing is equal to or lower than positive power supply voltage VDDL, which may be 1.2V, for example. Level shifter 20 outputs an output signal to output node 14, which output signal has a swing equal to about positive power supply voltage VDDH. Output node 14 is also an output node of D flip-flop 10. Positive power supply voltage VDDH may be about 2.5V in some exemplary embodiments. Positive power supply voltage VDDH may also be between about 150 percent to about 250 percent positive power supply voltage VDDL in some embodiments, although their relative values may be different. Level shifter 20 has a second output node 16, which has the swing equal to or lower than positive power supply voltage VDDL. The output signal on node 16 is passed through switch SW2, and outputted to the output node QOUT, which is the output node of DFF 10.

Level shifter 20 further includes input node 18, which receives a voltage (a duty-cycle control voltage), and uses the duty-cycle control voltage to adjust the duty cycle of level shifter 20. Accordingly, the duty cycle of the output signal on output node 14 of level shifter 20 may be adjusted through the adjustment of the duty-cycle control voltage.

DFF 10 is operated by complementary clocks CLK and CLKB, which are provided to the respective clock nodes (also denoted using reference notations CLK and CLKB, respectively). In some exemplary embodiments, the data on the selected input among inputs DIN1, DIN2 . . . and DINx is passed to node 12 upon a rising edge of clock signal CLK, and then passed to output node 16 of level shifter 20. In alternative embodiments, the falling edges of clock signal CLK may be used. The stored data on node 16 may be passed to output node QOUT upon the rising edge of clock signal CLKB, although the falling edge may also be used. Accordingly, DFF 10 in FIG. 1 has the function of capturing values from its input (such as node 12), and passing the value to the output nodes 14 and 16.

Figure 2:
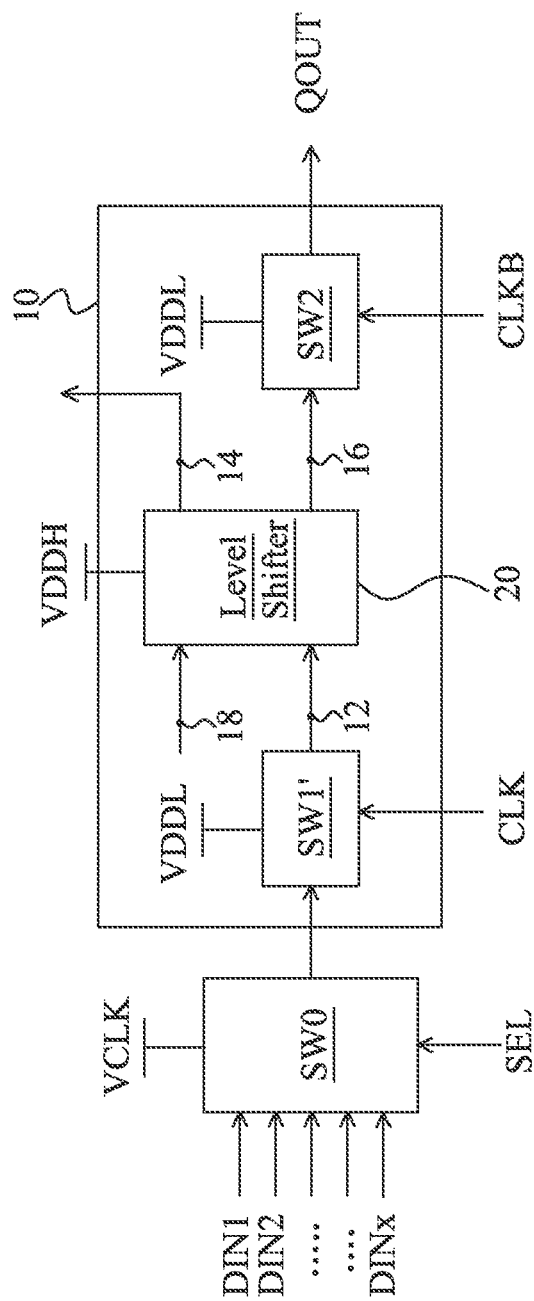
FIG. 2 is a block diagram of a D flip-flop in accordance with alternative exemplary embodiments, wherein the D flip-flop includes a level shifter built in the D flip-flop, and receives an output from a multi-input switch.

FIG. 2 illustrates DFF 10 in accordance with alternative embodiments. These embodiments are similar to the embodiments in FIG. 1, except that multi-input switch SW1 in FIG. 1 is separated into multi-input switch SW0 and switch SW1'. In the illustrated embodiments, switch SW1' is an integrated part of DFF 10, and multi-input switch SW0 is outside of DFF 10. Multi-input switch SW0, however, may also be an integrated part of DFF 10 in alternative embodiments.

Figure 3:
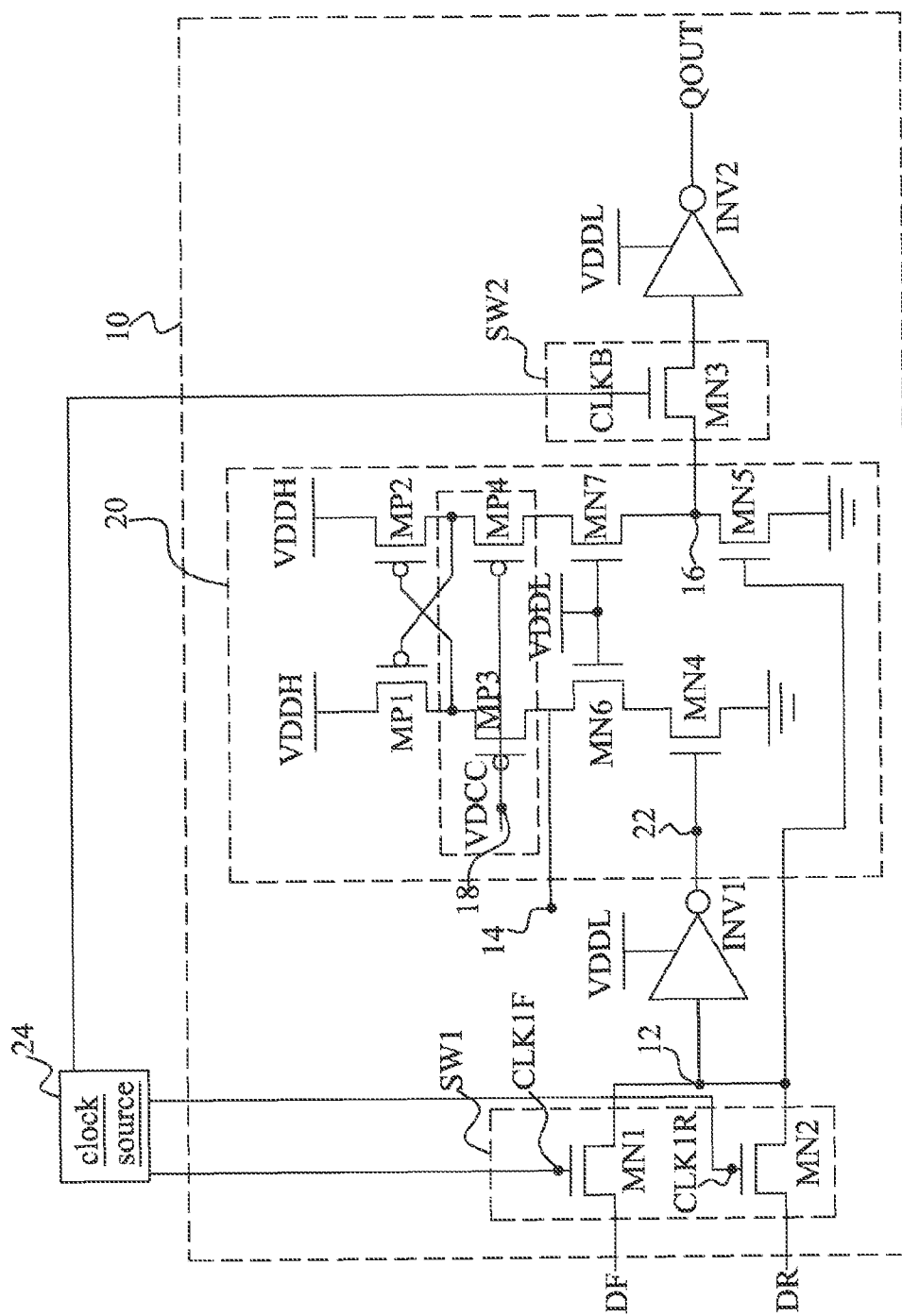
FIG. 3 illustrates a circuit diagram of a D flip-flop implementing the D flip-flop in FIG. 1.

FIG. 3 illustrates an exemplary circuit diagram of an implementation of the DFF 10 in FIG. 1. In the illustrated exemplary embodiments, switch SW1 includes NMOS transistor MN1 and MN2, each having a source/drain (which means a source or a drain) connected to node 12. Inputs DF and DR correspond to the inputs DIN1 and DIN2 in FIG. 1, for example. Although two inputs are used as an example, additional inputs and additional MOS transistors (not shown) may be added and connected to node 12, wherein the additional inputs and MOS transistors may be essentially the same as inputs DF and DR and NMOS transistor MN1 and MN2. In some embodiments, there may be 16, 32, 64, 128, 256, or more inputs and the respective NMOS transistors connected to node 12. In alternative embodiments, PMOS transistors may be used in switch SW1 to replace the NMOS transistors.

Clock nodes CLK1F and CLK1R form the input selection node SEL in FIG. 1. The clock signals on clock nodes CLK1F and CLK1R are also denoted as CLK1F and CLK1R, respectively. Clock signals CLK1F and CLK1R are provided to the gates of NMOS transistors MN1 and MN2, respectively, to control the connections from input nodes DF and DR to node 12. Clock source 24 may be used to generate clock signals CLK1F, CLK1R, and CLKB. Clock source 24 is such configured so that at most one of clock signals CLK1F and CLK1R toggles during one period of time, and the other clock signal does not toggle. Throughout the description, the clock signal (either CLK1F and CLK1R, but not both) that toggles is referred to as an active clock signal, while the one of nodes CLK1F and CLK1R does not receive the toggled clock signal is referred to as receiving an inactive clock signal. The input node DF or DR that is controlled by the active clock signal is also referred to as an active input node, and the input node DF or DR that is controlled by the inactive clock signal is referred to as an inactive input node. For example, assuming at a time, clock signal CLK1F toggles, and clock node CLK1R does not receive any toggled clock signal, then during this period of time, clock signal CLK1F is referred to as an active clock signal, clock signal CLK1R (even through it does not toggle, and hence is theoretically not a clock signal) is referred to as an inactive clock signal. Input nodes DF and DR are accordingly referred to as an active input node and an inactive node, respectively. If there are more than two inputs, there will be more than two clock signals, and during one period of time, at most one of the clock signals is an active clock signal, and other clock signals are inactive clock signals that do not toggle.

Figure 5:
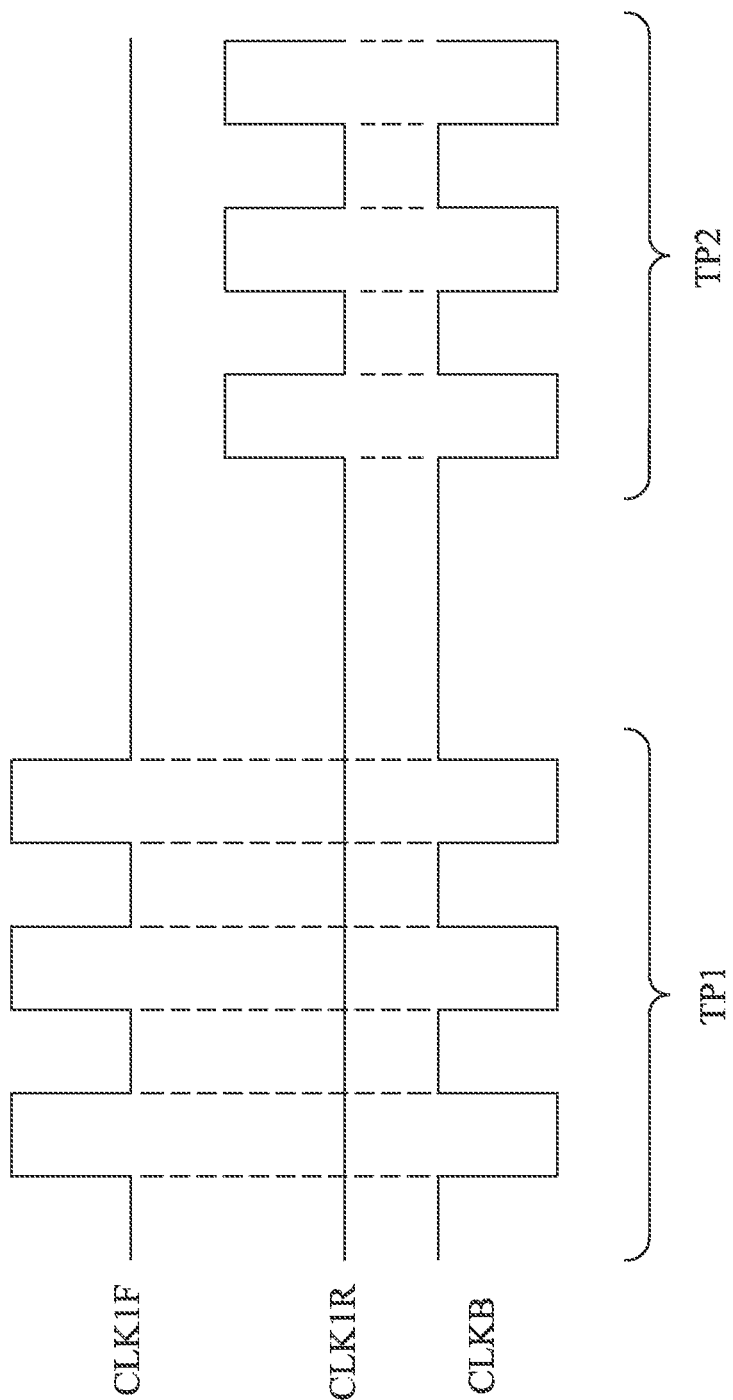
FIG. 5 illustrates exemplary clock signals used by the D flip-flop in FIG. 3.

Clock signal CLKB is the complementary signal of the active clock signal that toggles, which may be either clock signal CLK1F or clock signal CLK1R, but not both, during a selected period of time. For example, FIG. 5 illustrates exemplary clock signals CLK1F, CLK1R, and CLKB. During time period TP1, clock signal CLK1F is active, and clock signal CLK1R is inactive. Clock signal CLKB is hence the complementary of clock signal CLK1F during time period TP1. During time period TP2, clock signal CLK1R is active, and clock signal CLK1F is inactive. Clock signal CLKB is hence the complementary of clock signal CLK1R during time period TP2.

Figure 4:
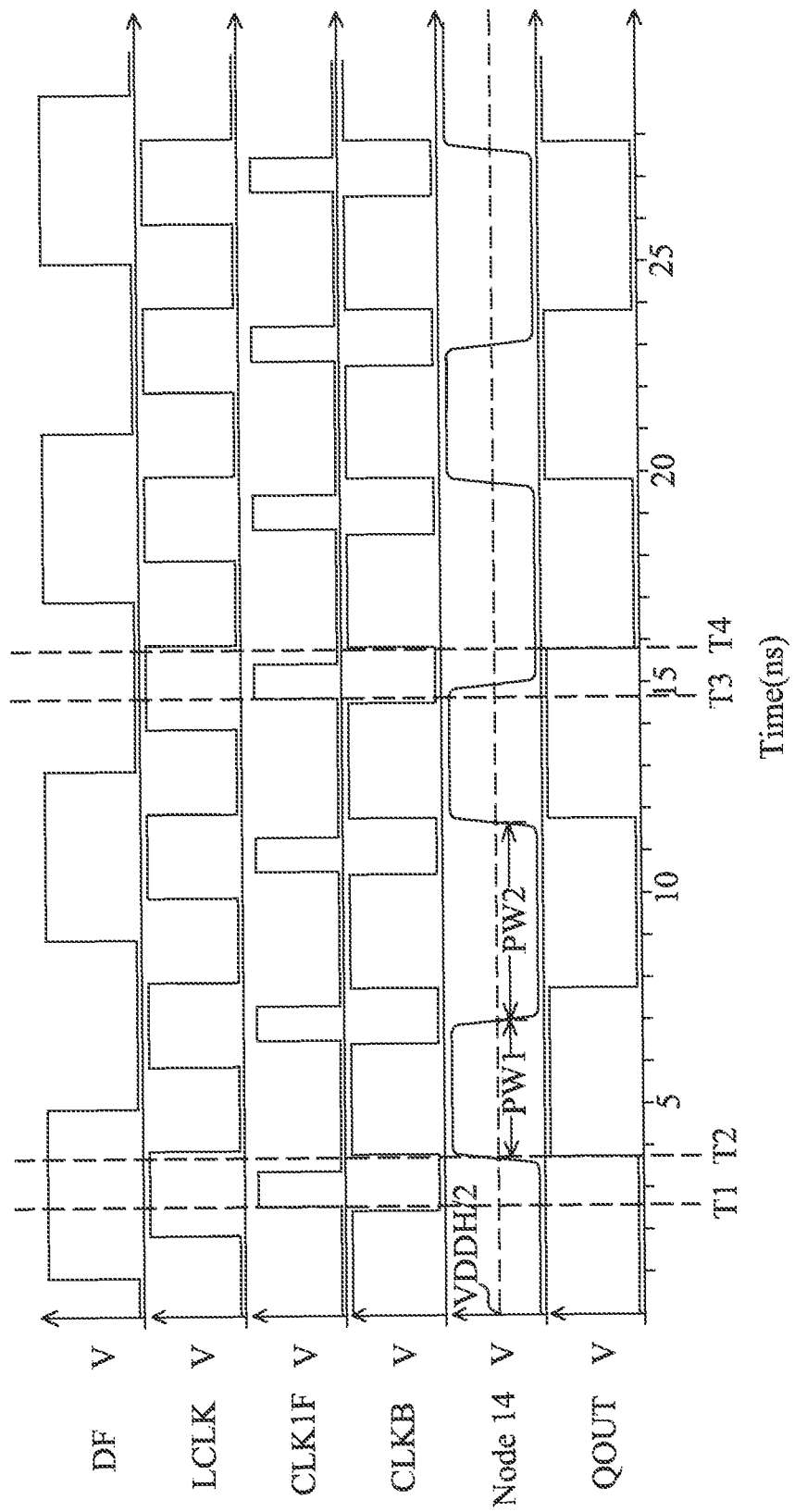
FIG. 4 illustrates exemplary sequence diagrams of the voltages on the nodes in the D flip-flop in FIG. 3.

In the subsequent discussion of the embodiments, input node DF is assumed as the active input node to explain the concepts of embodiments. FIG. 4 illustrates the exemplary sequence diagram of the DFF 10 in FIG. 3, wherein the waveforms of various nodes in DFF 10 are illustrated. Among the waveforms, signal LCLK represents an exemplary signal that is used by clock source 24 to generate clock signals CLK1F, CLK1R, and CLKB. In the following discussion of an exemplary operation of DFF 10, both FIGS. 3 and 4 are referred to, from which the discussed reference notations may be found. Referring to FIG. 4, at the rising edge of clock CLK1F (time point T1 in FIG. 4), NMOS transistor MN1 (FIG. 3) is turned on, and hence the signal on input node DF is passed to node 12. As shown in FIG. 4, the input signal on input node DF at time point T1 is a logic high signal, for example, 1.2V. Due to the characteristics of NMOS transistor MN1, the swing of the signal on node 12 is lower than the swing of clock signal CLK1F by a difference equal to the threshold voltage of NMOS transistor MN1. To compensate for this difference, clock signal CLK1F (and CLK1R and CLKB) may be overdriven to ensure that the swing of the signal on node 12 is brought up. For example, assuming the swing of the input signal on input node DF (FIG. 3) is equal to power supply voltage VDDL (1.2V, for example), then the swing of clock signal CLK1F is set to 1.5V assuming the threshold voltage of NMOS transistor MN1 is 0.3V, so that the swing of the signal on node 12 is brought back to VDDL. With clock signals CLK1F, CLK1R, and CLKB being overdriven, switches SW1 and SW2 (FIG. 1) may have simple structures, for example, using single NMOS transistors rather than passing gates, so that the chip area occupancy of switches SW1 and SW2 is reduced.

With the logic high signal being sent to node 12, inverter INV1 (FIG. 3) inverts the logic high signal on node 12 to a logic low signal (VSS, which may be an electrical ground, for example) and puts the logic low signal on node 22. Node 16 accordingly has the logic low signal through the operation of level shifter 20. At time point T2 (FIG. 4), the rising edge of clock signal CLKB causes NMOS transistor MN3 (FIG. 3) to be turned on, and hence the input of inverter INV2 (FIG. 3) receives the logic low signal, and outputs a logic high signal to the output node QOUT. Accordingly, the logic high signal that is captured at time point T1 (FIG. 4) is output to node QOUT.

Time points T3 and T4 are illustrated to present the capture of a logic low signal from input node DF at time point T3, and the outputting of the logic low signal to output node QOUT at time point T4.

Input signals on input nodes DF and DR and signals on nodes 12, 22, 16, and QOUT are referred to as small-swing signals having a first swing. The small-swing signals may toggle between 0V and VDDL (1.2V, for example), and hence the first swing is VDDL. Level shifter 20 receives the input signal from nodes 12 and 22, and level-shifts the input signal as a high-swing signal having a second swing greater than the first swing. For example, the high-swing signal may toggle between 0V and VDDH (2.5V, for example), and hence the second swing is VDDH. The high-swing signal may be outputted out of DFF 10 from output node 14. The waveform of the output signal on output node 14 is illustrated in FIG. 4.

Referring back to FIG. 3, in some exemplary embodiments, level shifter 20 includes NMOS transistors MN4, MN5, MN6, and MN7, and PMOS transistors MP1, MP2, MP3, and MP4. Transistors MN4, MN6, MP3, and MP1 are cascaded, and transistors MN5, MN7, MP4, and MP2 are cascaded. The gates of NMOS transistors MN6 and MN7 are connected to positive power supply voltage VDDL. Level shifter 20 is powered by positive power supply voltage VDDH. PMOS transistors MP1, MP2, MP3, and MP4 form a latch.

The gates of PMOS transistor MP3 and MP4 are connected to input node 18, which receives a duty-cycle control voltage VDCC. The duty-cycle control voltage VDCC is close to voltage VDDL, and may be adjusted around voltage VDDL. By adjusting duty-cycle control voltage VDCC, the duty cycles of the output signals provided to output nodes 14 and QOUT can be adjusted. For example, referring to the output signal on node 14 in FIG. 4, pulse width PW1 may be adjusted to equal to pulse width PW2, wherein pulse width PW1 is the width of the pulses over the half-voltage level VDDH/2, and pulse width PW2 is the width of the pulses below the half-voltage level VDDH/2.

In level shifter 20, all MOS transistors may use thin oxides. For example, assuming power supply voltage VDDH is about 2.5V, and power supply voltage VDDL and duty-cycle control voltage VDCC are about 1.2V, the gate oxides of all MOS transistors in level shifter 20 are applied with voltages equal to or lower than about 1.3V. Accordingly, all MOS transistors in level shifter 20 may be formed using thin-oxides, and hence the chip area occupancy of level shifter 20 is reduced. Similarly, all MOS transistors in DFF 10 may use thin oxides.

In the embodiments, the multi-input DFF may selectively receive input signals from a plurality of inputs, and output the selected input signal. The operating efficiency is thus improved. Furthermore, the built-in level shifter generates a high-swing signal from the received small-swing signals. The high-swing signals generated form the multi-input DFF may be used in various applications including, and not limited to, Dynamic Pattern Generators (DPGs), which are electron-reflective devices for controlling the e-beam that is used to directly write to wafers in the manufacturing of integrated circuits.

In accordance with embodiments, a D flip-flop includes a first switch, a level shifter, and a second switch therein. The first switch includes a first input and a first output. The level shifter includes a second input coupled to the first input, and a second output. The second switch includes a third input coupled to the second output, and a third output. The first input and the third output form an input and an output of the D flip-flop.

In accordance with other embodiments, a device includes a first switch and a second switch. The first switch includes a first input and a second input, a first output, and at least one input selection node. The at least one input selection node is configured to control a first connection between a first one of the first and the second inputs and the first output, and control a second connection between a second one of the first and the second inputs and the first output. The second switch includes a third input coupled to the first output, and a second output. The first switch and the second switch form a multi-input D flip-flop.

In accordance with yet other embodiments, a method includes during a first period of time, in response to a first clock signal, receiving a first input signal from a first input node of a D flip-flop into the D flip-flop, wherein the first input signal has a first swing. The method further includes generating from the first input signal a second signal having a second swing greater than the first swing, outputting the second signal out of a first output of the D flip-flop, and, in response to a second clock signal complementary to the first clock signal, outputting the first input signal out of a second output of the D flip-flop.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a first switch comprising a first input and a first output;
   a level shifter comprising:
      a second input coupled to the first output;
      a second output, wherein the level shifter is configured to output a first output signal having a second swing equal to or smaller than a first swing of an input signal on the first input; and
      a third output, wherein the level shifter is configured to output a second output signal having a third swing greater than the first swing; and
   a second switch comprising:
      a third input coupled to the second output of the level shifter; and
      a fourth output, wherein the first switch, the level shifter, and the second switch form a D flip-flop, and wherein the first input and the fourth output form an input and an output of the D flip-flop.

2. The device of claim 1, wherein the level shifter is configured to generate a high-swing signal from a small-swing signal on the first input, and wherein the high-swing signal has a swing greater than a swing of the small-swing signal.

3. The device of claim 1, wherein the level shifter comprises a duty-cycle control input, and wherein the level shifter is configured to adjust a duty cycle of a signal on the third output in response to a change of a voltage on the duty-cycle control input.

4. The device of claim 1, wherein the first switch is a multi-input switch comprising:
   a fourth input; and
   at least one input selection node, wherein the first switch is configured to select a signal from one of the first and the fourth inputs in response to a selection signal on the at least one input selection node, and pass the signal to the first output.

5. The device of claim 4, wherein the first switch comprises:
   a first NMOS transistor comprising a first source/drain region connected to the first input of the first switch, and a second source/drain region connected to the first output; and
   a second NMOS transistor comprising a third source/drain region connected to the fourth input of the first switch, and a fourth source/drain region connected to the first output, and wherein the at least one input selection node comprises:
      a first clock input connected to a gate of the first NMOS transistor; and
      a second clock input connected to a gate of the second NMOS transistor.

6. The device of claim 5 further comprising a clock source comprising:
   a first output connected to a gate of the first NMOS transistor;
   a second output connected to a gate of the second NMOS transistor; and
   a third output connected to the second switch, wherein the clock source is configured to output:
      a first clock signal to the first output of the clock source;
      a second clock signal to the second output of the clock source, wherein the clock source is configured to allow at most one of the first and the second clock signals to toggle during a period of time, with the selection signal comprising edges of the first and the second signals; and
      a third clock signal to the third output of the clock source, wherein the clock source is configured to generate the third clock signal as a complementary signal of a toggled one of the first and the second clock signals.

7. The device of claim 1, wherein the third swing is in a range between about 150 percent and about 250 percent of the first swing.

8. A device comprising:
a first switch comprising:
a first input and a second input;
a first output; and
at least one input selection node configured to control a first connection between a first one of the first and the second inputs and the first output, and control a second connection between a second one of the first and the second inputs and the first output;
a second switch comprising:
a third input coupled to the first output; and
a second output, wherein the first switch and the second switch form a multi-input D flip-flop; and
a level shifter coupled between the first switch and the second switch, the level shifter comprising:
a first input coupled to the first output of the first switch;
a third output configured to output a high-swing signal, wherein the level shifter is configured to generate the high-swing signal from a small-swing signal on the first output of the first switch, with the high-swing signal having a swing greater than a swing of the small-swing signal; and
a fourth output of the second switch, wherein the third input of the second switch is configured to receive signals from the fourth output.

9. The device of claim 8, wherein the first switch further comprises:
a first NMOS transistor comprising:
a first source/drain region connected to the first input;
a second source/drain region connected to the first output; and
a first gate connected to the at least one input selection node; and
a second NMOS transistor comprising:
a third source/drain region connected to the second input;
a fourth source/drain region connected to the first output; and
a second gate connected to the at least one input selection node.

10. The device of claim 9 further comprising a clock source comprising:
a first output connected to the first gate, wherein the clock source is configured to output a first clock signal to the first gate;
a second output connected to the second gate, wherein the clock source is configured to output a second clock signal to the second gate; and
a third output connected to a control node of the second switch, wherein the clock source is configured to output a third clock signal to the control node of the second switch, and wherein the clock source is configured to generate the third clock signal as a complementary signal of a toggled one of the first and the second clock signals.

11. The device of claim 10, wherein the clock source is configured to make at most one of the first and the second clock signal to toggle during a period of time.

12. The device of claim 10, wherein the clock source is configured to generate the first, the second, and the third clock signals to have swings greater than swings of input signals on the first and the second inputs.

13. The device of claim 8, wherein the level shifter comprises a duty-cycle control input, and wherein the level shifter is configured to adjust a duty cycle of a signal on the fourth output of the level shifter in response to a change in a voltage on the duty-cycle control input.

14. The device of claim 8, wherein the high-swing signal has a first swing in a range between about 150 percent and about 250 percent of a second swing of the small-swing signal.

15. A method comprising:
during a first period of time, in response to a first clock signal, receiving a first input signal from a first input node of a D flip-flop into the D flip-flop, wherein the first input signal has a first swing;
generating from the first input signal a second signal having a second swing greater than the first swing;
outputting the second signal out of a first output of the D flip-flop;
in response to a second clock signal complementary to the first clock signal, outputting the first input signal out of a second output of the D flip-flop;
during a second period of time, in response to a third clock signal, receiving a second input signal from a second input node of the D flip-flop into the D flip-flop, wherein the second input signal has the first swing;
generating from the second input signal a third signal having the second swing;
outputting the third signal out of the first output of the D flip-flop; and
in response to the second clock signal complementary to the third clock signal, outputting the second input signal out of the second output of the D flip-flop.

16. The method of claim 15, wherein the step of generating the second signal is performed using a level shifter.

17. The method of claim 16 further comprising adjusting a duty-cycle of the level shifter.

18. The method of claim 15, wherein during the first period of time, the third clock is a non-toggling signal, and wherein during the second period of time, the first clock is a non-toggling signal.

19. The method of claim 15, wherein the second swing is in a range between about 150 percent and about 250 percent of the first swing.

* * * * *